(12) United States Patent
Feller et al.

(10) Patent No.: US 7,731,864 B2
(45) Date of Patent: Jun. 8, 2010

(54) SLURRY FOR CHEMICAL MECHANICAL POLISHING OF ALUMINUM

(75) Inventors: Allen Daniel Feller, Portland, OR (US); Anne E. Miller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 11/172,093

(22) Filed: Jun. 29, 2005

(65) Prior Publication Data

US 2007/0004209 A1    Jan. 4, 2007

(51) Int. Cl.
*C09K 13/00* (2006.01)

(52) U.S. Cl. .................. 252/79.1; 252/79.2; 252/79.3; 252/79.4; 438/633; 438/692; 438/705; 216/88

(58) Field of Classification Search ............... 252/79.1, 252/79.4; 438/633, 692, 689
See application file for complete search history.

(56) References Cited

U.S. PATENT DOCUMENTS

| | | | |
|---|---|---|---|
| 6,083,419 A | 7/2000 | Grumbine et al. | |
| 6,136,711 A | 10/2000 | Grumbine et al. | |
| 6,334,880 B1 * | 1/2002 | Negrych et al. | 51/308 |
| 6,562,091 B2 * | 5/2003 | Kim | 51/309 |
| 7,071,105 B2 | 7/2006 | Carter et al. | |
| 7,442,645 B2 | 10/2008 | Carter et al. | |
| 2004/0152309 A1 * | 8/2004 | Carter et al. | 438/689 |
| 2004/0162006 A1 * | 8/2004 | Hua et al. | 451/36 |
| 2005/0233578 A1 * | 10/2005 | Jia et al. | 438/633 |
| 2005/0236601 A1 * | 10/2005 | Liu et al. | 252/79.1 |

FOREIGN PATENT DOCUMENTS

| | | |
|---|---|---|
| WO | WO-0130928 | 5/2001 |
| WO | WO 03/040252 A | 5/2003 |
| WO | PCT/US2006/025749 | 6/2006 |

OTHER PUBLICATIONS

Office Action from Taiwan Patent Application No. 95123381, mailed Mar. 3, 2009, 13 pgs.
International Preliminary Report on Patentability from PCT/US2006/025749 mailed Jan. 17, 2008, 7 pgs.

* cited by examiner

*Primary Examiner*—Nadine G Norton
*Assistant Examiner*—Mahmoud Dahimene
(74) *Attorney, Agent, or Firm*—Blakely, Sokoloff, Taylor & Zafman LLP

(57) ABSTRACT

Described herein are embodiments of a slurry used for the chemical mechanical polishing a substrate that includes aluminum or an aluminum alloy features having a width of less than 1 um. The slurry includes a precipitated silica abrasive having a diameter of less than or equal to 100 nm and a chelating buffer system comprising citric acid and oxalic acid to provide a pH of the slurry in the approximate range of 1.5 and 4.0.

8 Claims, 4 Drawing Sheets

SLURRY FOR CHEMICAL MECHANICAL POLISHING OF ALUMINUM

BACKGROUND

1. Field

Embodiments of the present invention relate to the field of microelectronic device fabrication. In particular, an embodiment of the present invention relates to chemical mechanical polishing slurries for aluminum and aluminum alloys.

2. Discussion of Related Art

Chemical mechanical polishing (CMP) techniques are used in the semiconductor industry to remove thin films from the surface of semiconductor substrates. One common use of these techniques is to form metal interconnect lines, vias, or contacts by (a) patterning and etching trenches or holes in an dielectric layer, (b) depositing a blanket of metal, and (c) chemically mechanically polishing away the metal lying over the dielectric layer. FIGS. 1a to 1c illustrate the formation of aluminum interconnect lines using this process.

FIG. 1a shows the cross sectional view of two trenches 110 that have been patterned and etched into a dielectric layer 102. The dielectric layer 102 lies over a silicon substrate 100. FIG. 1b shows the trenches 110 after the blanket deposition of a barrier layer 104 and a layer of aluminum 106. FIG. 1c shows the cross sectional view of two interconnect lines 112 that have been formed after the CMP step is complete.

The apparatus of a typical CMP process is illustrated in FIG. 2. The substrate wafer 200 is placed face down on a polishing pad 212 which is attached to a rotating table 214. In this way, the thin film to be polished is placed in direct contact with the pad 212. A carrier 216 is used to apply a downward pressure F against the backside of the substrate wafer 200. During the polishing process, the carrier as well as the table 214 and pad 212 are rotated while a chemically reactive and abrasive solution, commonly referred to as a "slurry" 222, is pumped onto the surface of the pad 212.

The slurry 222 facilitates the polishing process by chemically reacting with the thin film and by providing an abrasive material to remove the thin film while the table 214 rotates. Slurry composition is an important factor in the manufacturability of the process.

Prior art slurry compositions for the polishing of aluminum contained strong oxidizers such as hydrogen peroxide ($H_2O_2$) or persulfate ions ($S_2O_8^{2-}$) and harsh etchants such as mineral acids or harsh oxidizing ethants such as potassium fluoride (KF). These chemistries were needed to remove thick layers of aluminum oxide created by the strong oxidizers. But, this combination of chemistries leads to chemical attack recessing of the aluminum 103 metal line or via below the surface of the dielectric layer, as shown in FIG. 1c. In the case of KF chemistry, it also leads to chemical attack on the dielectric layer 102. The recessing creates nonplanarities that propagate to subsequent layers and impair the ability to print narrow, high density lines on those layers. The recessing may also affect the integrity of the metal lines or vias formed during the CMP step, presenting reliability problems. For the thin metal thickness used in front end applications, the high recess can lead to complete removal of the Al layer. Additionally, the formation of a thick layer of alumina ($Al_2O_3$) by the oxidizing agent produces an increased concentration of alumina. This alumina acts as an aggressive abrasive and causes excessive surface roughness and scratching of the aluminum 103. As the width of the aluminum 103 interconnect lines is reduced to smaller and smaller widths, the affects of recessing, surface roughness, and scratching become increasingly problematic.

DETAILED DESCRIPTION

Figure 1A:
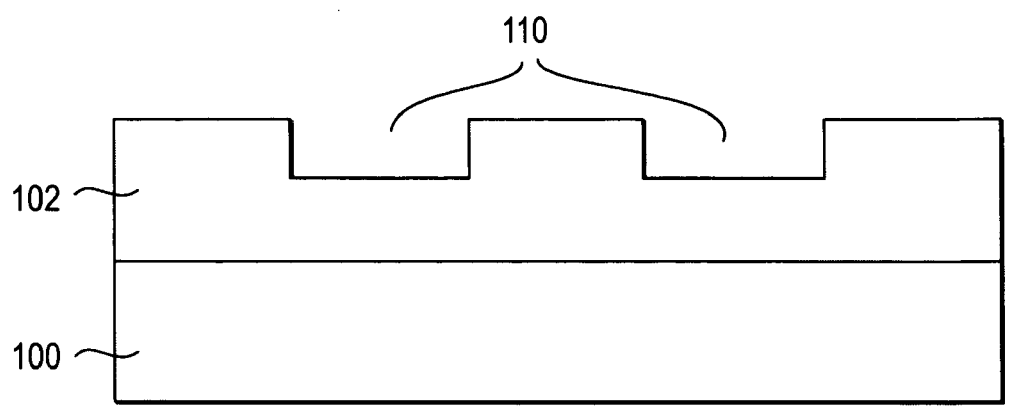
FIGS. 1A-1C illustrate the cross-sectional views of a substrate that includes aluminum that is polished by a prior art chemical mechanical polishing slurry.
Figure 1B:
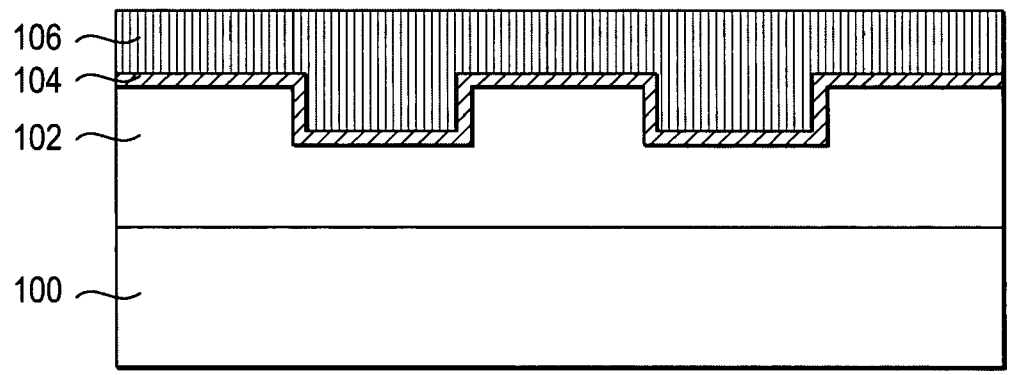
Figure 1C:
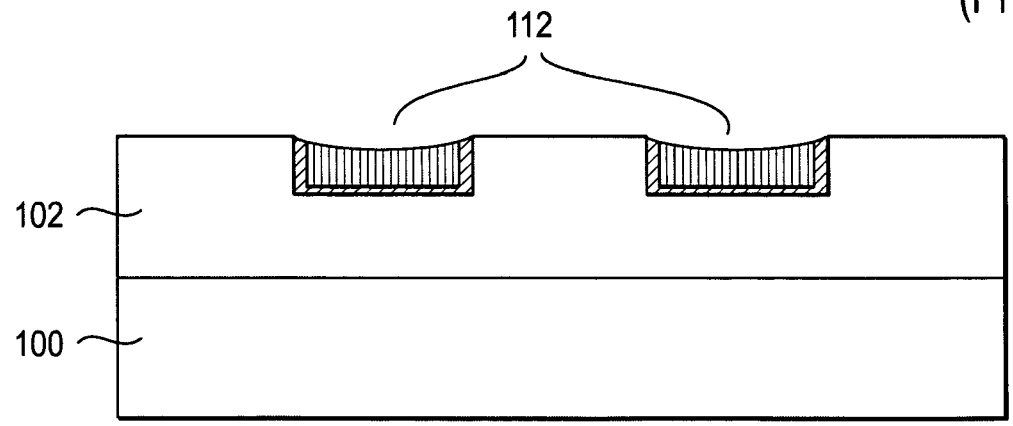

Chemical mechanical polishing slurries and methods for the chemical mechanical polishing (CMP) of substrates that include aluminum used in the manufacture of integrated circuits are described. In the following description numerous specific details are set forth, such as specific machinery, materials, and thicknesses, in order to provide a thorough understanding of the present invention. It will be obvious, however, to one skilled in the art that the present invention may be practiced without these specific details. In other instances, other well known processes and machinery have not been described in particular detail in order to avoid unnecessarily obscuring the present invention.

The novel slurries and CMP processes of embodiments of the present invention may be used to polish a substrate that includes aluminum or an aluminum alloy in either a front-end-of-the-line or back-end-of-the-line process. In a front-end-of-the-line process, aluminum contacts to transistor gates may be polished. In a back-end-of-the-line process, aluminum interconnect lines and vias formed by a dual damascene process may be polished. The teachings of the embodiments of the present invention, however, can be applied to other processes in the manufacture of integrated circuits including, but not limited to, planarization of various layers. In fact, the teachings of the present invention can be applied to CMP processes used in areas other than integrated circuit manufacturing.

FIGS. 3A to 3D illustrate the formation of aluminum contacts in a front-end-of-the-line process with a CMP process using the slurries of the present invention. The aluminum contacts are formed over a substrate 300. The substrate is preferably a silicon wafer, but can be another semiconductor such as gallium arsenide or germanium, or can also be some other material that is not a semiconductor such as ceramic. A dielectric layer 302 lies over the substrate. Various layers, not shown, may lie between the substrate 300 and the dielectric layer 302. These layers might include, gate electrodes, isolation regions, capacitors, or other features. The dielectric layer 302 is generally an undoped silicon dioxide, a phosphosilicate glass, or a borophosphosilicate glass formed by chemical vapor deposition (CVD). Other dielectric layers, such as silicon nitride, or multilayer composite dielectrics, including such substances as spin on glass, may also be used. In one particular embodiment, the dielectric layer may be a low-k dielectric material such as carbon doped oxide. The function of the dielectric layer 302 is to electrically isolate the subsequently formed interconnect lines from any underlying conductive layer. The dielectric layer 302 can be formed by techniques well known in the art.

First, openings 310 are formed in the dielectric layer 302. A photoresist layer is formed over the dielectric layer 302 that is then masked, exposed, and developed with techniques well known in the art, to define locations for the openings 310. The dielectric layer 302 is then etched with techniques well known in the art, such as reactive ion etch, to form openings 310. The openings 310 may have a width of approximately 1 um or less to form aluminum contacts having the same width.

Next, an adhesion layer 304 is blanket deposited over the dielectric layer 302. The function of the adhesion layer 304 is to ensure uniform coverage of the deposited aluminum layer 306 into the openings 310. The adhesion layer 304 is formed to a thickness of approximately 40 angstroms by well known methods, such as sputtering or CVD. Materials such as titanium, or titanium nitride, or a combination thereof may be used to form the adhesion layer 304.

Next, an aluminum layer 306 is blanket deposited over the adhesion layer 304 using well known means such as sputtering or CVD. The deposition forms an aluminum layer 306 to a thickness of between 1000 angstroms and 10,000 angstroms but typically approximately 2,000 angstroms to completely fill openings 310 with aluminum. The thickness of the aluminum layer 306 above the dielectric layer 302 may be approximately 1500 angstroms and 2000 angstroms. In order to obtain proper fill of openings 310 the aluminum is heated to at least 350 degrees Celcius (C) but preferably less than 550 degrees C. Note that the combination of process steps described are consistent with an Al damascene process that could be used for backend interconnect formation. However, the adhesion layer deposition, aluminum trench deposition, and subsequent anneal may be used to complete the metal fill for front end of line process such as replacement metal gate process as have been discussed in the literature. The subsequent Al polish processes remain the same for both front end of the line and back end of the line processes.

Figure 2:
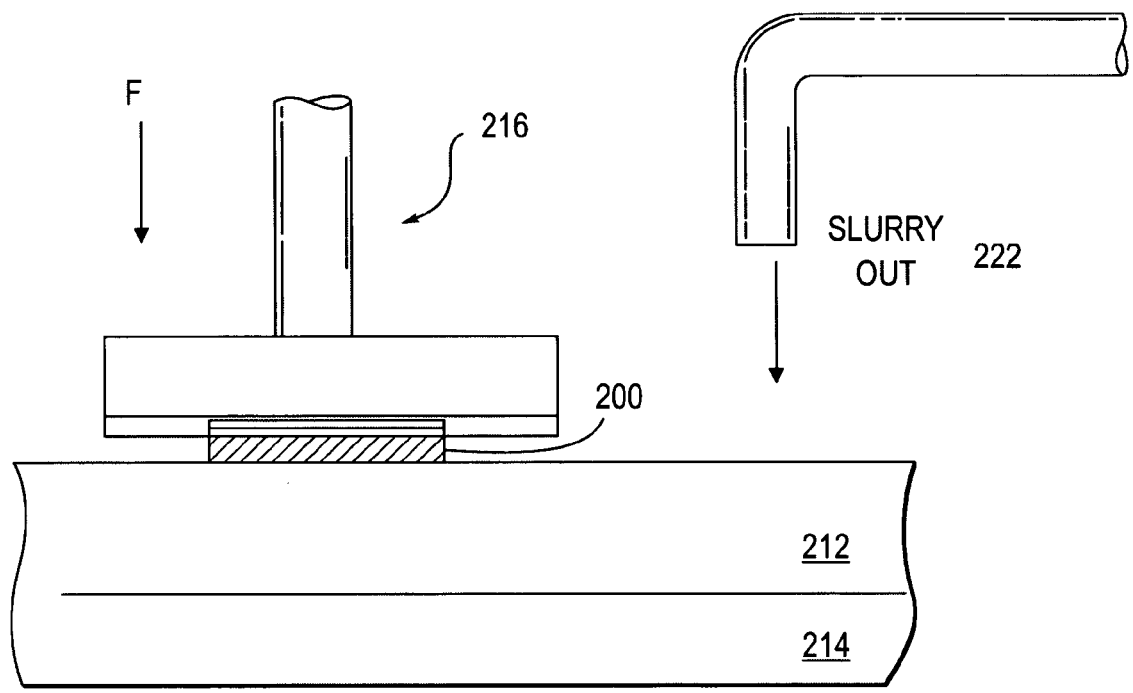
FIG. 2 is an illustration of a three-dimensional view of a prior art chemical mechanical polishing apparatus used to polish a substrate that includes aluminum using a slurry from the prior art.
Figure 3A:
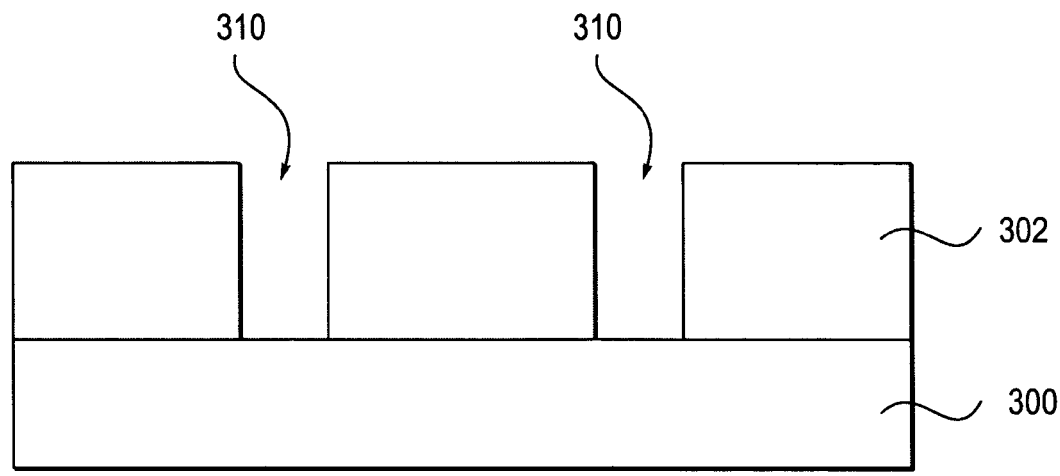
FIGS. 3A-3D illustrate the cross-sectional view of the formation of a substrate that includes aluminum using a novel chemical mechanical polishing slurry.
Figure 3B:
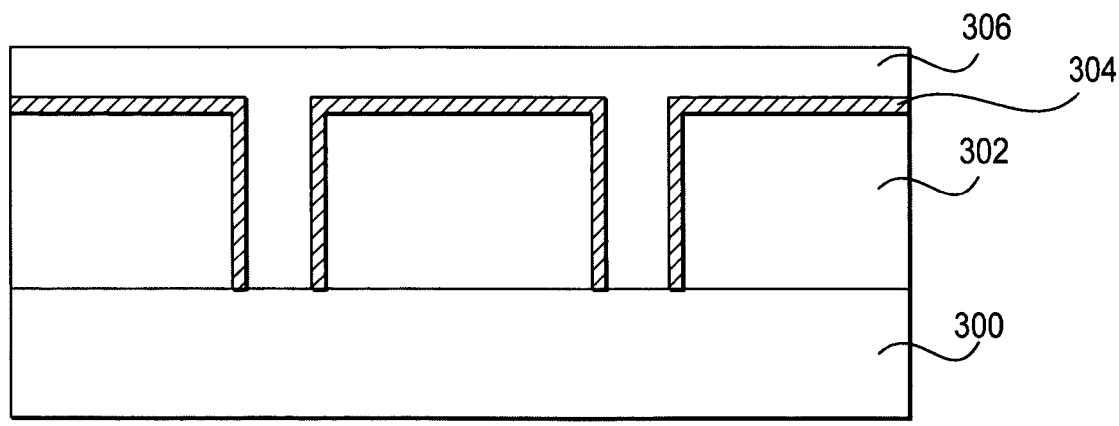
Figure 3C:
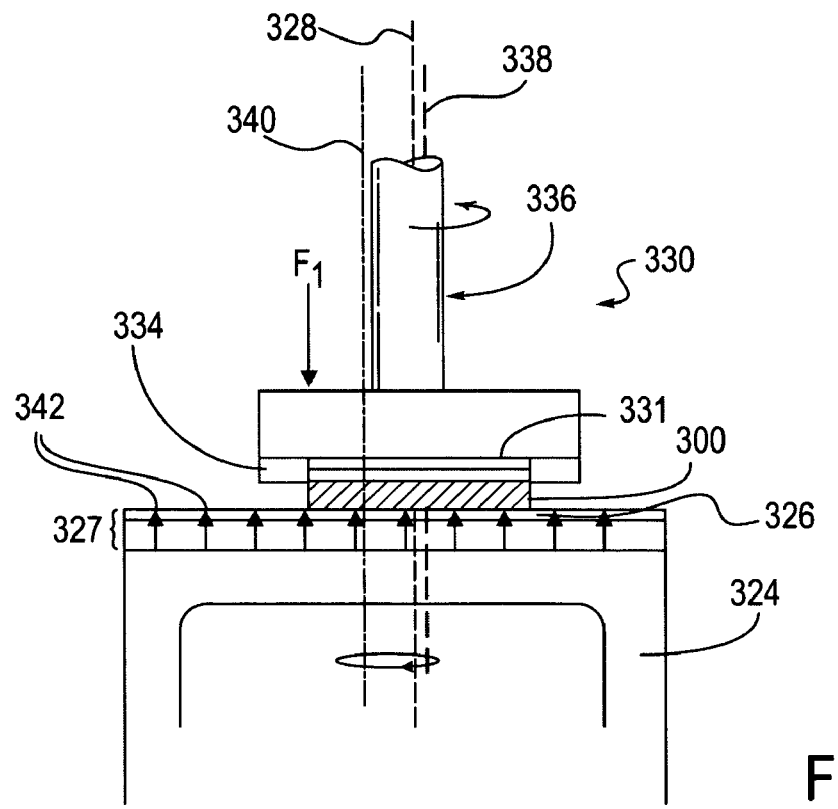
Figure 3D:
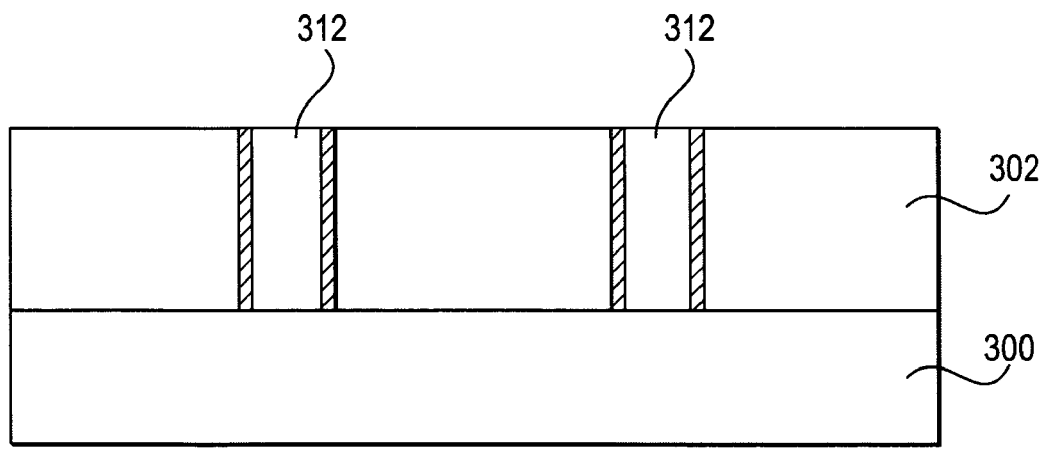

Next, aluminum layer 306 and adhesion layer 304 are chemically mechanically polished to form aluminum contacts having a width of less than or equal to approximately 1 um. In an embodiment, the apparatus illustrated in FIG. 3C may be used to chemically mechanically polish the substrate that includes aluminum. Another similar apparatus, such as that shown in FIG. 2, can also be used.

Substrate 300 is placed face down on a polishing pad 326 of pad assembly 327 that is fixedly attached to the upper surface of a table 324. In this way the substrate that includes aluminum to be polished is placed in direct contact with the upper surface of pad 326. The polishing process is facilitated by uniformly distributing slurry at the substrate/pad interface while pad 326 orbits about a fixed point 328 and substrate 300 rotates counter clockwise about its center 338. The flow rate of the slurry may be in the approximate range of 100 ml/minute and 300 ml/minute, or more particularly a flow rate of approximately 120 ml/min. A low flow rate for the slurry is valuable because it saves on costs. Polishing is continued in this manner until the desired amount of the aluminum is removed.

To facilitate polishing, a shaft 336 attached to carrier 330 can be used to apply a downward pressure F.sub.1 to the backside of substrate 300. In an embodiment the downward pressure is a low pressure in the approximate range of 0.1 to 2.0 psi, and more particularly in the approximate range of 1.0 to 1.5 psi. A low downward pressure is used to reduce the amount of aluminum oxide that is removed and thereby reduce scratching. The low pressure also serves to reduce roughness, erosion, and dishing in combination with embodiment of the slurries of the current invention. The backside of substrate 300 can be held in contact with carrier 330 by a vacuum or simply by wet surface tension. Preferably an insert pad 331 cushions substrate 300 from carrier 330. An ordinary retaining ring 334 can be employed to prevent substrate 300 from slipping laterally from beneath carrier 330 during processing.

To facilitate uniformity of polishing, the center 340 of table 324 and pad 426 orbits clockwise about a fixed point 328, with a radius of the orbit that is less than the radius of the substrate 300. The center 338 of substrate 300 is offset from the center 340 of pad 326 and from the axis of orbit 328. A rate of rotation sufficient to create a low downward pressure within the ranges described above may be used. For example, for a 12 inch polishing pad, the rate of rotation may be in the approximate range of 20 to 50 rpm, and more particularly approximately 30 rpm.

So that the slurry is delivered adequately and uniformly across the substrate/pad interface, the slurry is fed through a plurality of equally spaced holes 342 formed through polish pad 326. Polish pad 326 may be hard or soft. In an embodiment, a Rodel™ IC 1000 polyurethane based hard pad is used. In another embodiment, a soft felt-based porometrics pad such as a Politex™ pad may be used.

The key to obtaining good and manufacturable CMP results in embodiments of the present invention are the novel slurries for polishing aluminum or aluminum alloys. The slurry used for polishing the aluminum layer 306 is a slurry that includes a precipitated silica abrasive having a diameter of less than or equal to 100 nm (nanometers) and a chelating buffer system comprising citric acid and oxalic acid to provide a pH of the slurry in the approximate range of 1.5 and 4.0.

A precipitated silica abrasive having a small diameter is included in the slurry because it is a relatively soft abrasive and because it has a more uniform size and shape. Silica particles are less dense and softer than alumina. In addition, due to aqueous, low temperature processing, precipitated silica is less likely to contain hard dense aggregates that cause scratching and are typically found in fumed silica or alumina particles. Due to their uniform shape, precipitated silica particles also to tend to be more stable in solution and less likely to aggregate into large, hard particles that cause scratching. These properties aid in the prevention of scratching and roughness of the surface being polished. A soft small diameter abrasive is valuable in that it may reduce the scratching of the aluminum surface and may reduce the resulting roughness, thus providing a smooth polished surface. The precipitated silica may have a diameter of less than 100 nm, or in the range or 3 nm and 100 nm, or more particularly, in the approximate range of 10 nm and 50 nm. In one embodiment, the diameter of the precipitated silica may be approximately 35 nm. Precipitated silica is also valuable because its surface is reactive and picks up alumina from the surface of the substrate that includes aluminum to keep the alumina away from the surface where it may cause scratching and dishing. The amount of precipitated silica in the slurry may be in the approximate range of 1.0 and 10.0 weight percent but preferably in the approximate range of 2 to 5 weight percent.

The chelating buffer system is a combination of both citric acid and oxalic acid. The combination maintains the pH within a narrow range of approximately 1.5 and 4.0, and more particularly in the approximate range of 1.8 and 2.1. A low pH is valuable because it helps to keep the oxidized aluminum layer on the surface of the aluminum layer 306 relatively thin (less than 100 angstroms) because less aluminum oxide (alumina) is formed. The less alumina that is formed, the smoother the surface will be due to a reduction in scratching of the surface by the removed alumina. Additionally, the polishing of the aluminum layer 306 is faster when the layer of oxidized aluminum is thin. This combination is of particular value in polishing aluminum features, such as contacts or interconnect lines, that have a width of less than 1 um. The amount of citric acid that is added to the slurry is in the approximate range of 0.1 and 1.0 weight percent, and more particularly in the approximate range of 0.2 to 0.5 weight percent. The amount of oxalic acid added to the slurry may be in the approximate range of 0.1 and 1.0 weight percent but more particularly in the approximate range of 0.2 to 0.5 weight percent.

The formation of a thin aluminum oxide layer is due to the use of oxalic acid in the slurry. Oxalic acid is a mild oxidizer, and therefore does not form a thick layer of aluminum oxide (alumina). Oxalic acid is also valuable for use in embodiments of slurries described in this invention because it is a chelating agent that removes alumina from the surface of the aluminum layer 306 to aid in the prevention of scratching of the surface by the alumina. Acids similar to oxalic acid may be used in place of oxalic acid, such as other weak organic acids, e.g. ascorbic acid.

Citric acid is included in the slurry to act as part of the buffer system, but also because it is an effective chelating agent of alumina. Citric acid is a very good complexant for alumina in aqueous solutions and may therefore remove alumina from the surface of the aluminum layer 306. Citric acid is also valuable because it stabilizes a negative charge on the alumina particles once they are lifted from the surface of the aluminum layer 306. The charge of the alumina particles at pH <8 is changed from a positive charge to a negative charge. The charge on silica particles is negative at pH >2 and at pH <2 the charge is neutral to only very slightly positive. In the pH range >2, the citric acid may prevent the formation of agglomerates of the precipitated silica abrasive with the alumina particles. This is because the alumina has a strong negative charge that may cause it to be repelled from the negatively charged silica particles. It is hypothesized that a large amount of the scratching is due to the formation of the agglomerates. Therefore, the improved surfaces that result from the addition of citric acid to the slurries to polish alumina herein described may be in a large part due to the prevention of the formation of the agglomerates of silica and alumina.

The slurry may also include an interference agent such as tetraethylorthosilicate (TEOS.) TEOS is one particular reactive silanol agent, but it is to be understood that other reactive silanol agents may also be used in the slurry. The interference agent is an additive that adheres to any aluminum oxide particle aggregates during their formation to prevent aluminum oxide particle aggregates from growing relatively large. Relatively smaller aluminum oxide particle aggregates are less likely to scratch the surface that includes aluminum. The interference agent may also interfere with the growth of the aluminum oxide film on the surface including aluminum that is being polished. The aluminum oxide film may therefore remain relatively thin (much less than 100 angstroms), which in turn creates less aluminum oxide from which the aggregates may form. In sum, TEOS or other silanol agents may improve the quality of the polished aluminum surface by reducing the amount of scratching. The amount of TEOS in the slurry may be in the approximate range of 0.1 and 1.0 weight percent, and more particularly in the approximate range of 0.0.2 and 0.0.5 weight percent. The components of the slurry are mixed with water to form the slurry solution.

The combination of the precipitated silica abrasive having a diameter of less than 100 nm with the citric acid/oxalic acid chelating buffer system and with the TEOS interference agent creates a slurry for polishing aluminum that produces polished aluminum surfaces of high quality without significant scratching or recessing. The further combination of the slurry with the low down force of a soft polishing pad further improves the quality of the polished surfaces. The aluminum slurry described provides a solution to the previously unsolved problem of excessive scratching, roughness, and recessing of aluminum features having a width of less than 1 um.

In one particular embodiment, the slurry may include a precipitated silica abrasive having a diameter in the approximate range of 10 nm and 50 nm where the precipitated silica abrasive is present in the slurry in the approximate range of 2.0 and 5.0 weight percent. The chelating buffer system is formed of citric acid and oxalic acid to provide a pH of the slurry in an approximate range of 1.8 and 2.1. The amount of citric acid that is added to the slurry is in the approximate range of 0.2 to 0.5 weight percent. The amount of oxalic acid that is added to the slurry is in the approximate range of 0.2 to 0.5 weight percent. The slurry also includes TEOS in a concentration of approximately 0.01 and 0.1 weight percent.

The preferred composition of the novel aluminum slurry exhibits many qualities that make the CMP process extremely manufacturable. Aluminum removal rates in the approximate range of 1000 angstroms/second and 1500 angstroms/second have been achieved without excessive scratching, recessing, or dishing. This removal rate is sufficient such that overpolishing may not be needed. It is to be noted that reproducibility of results can depend on other factors in addition to slurry composition, such as pad type, polish pressure, and pad orbit rate.

The chemical mechanical polishing method described above may be performed using a single platen due to the thinness of the layer of aluminum to be removed. But, in an alternate embodiment, two platens may be used. In this embodiment a first platen may be used to remove a bulk layer of the aluminum layer 306 and the second platen may be used to clear the aluminum layer 306. In yet another embodiment, an additional platen may be used to buff the surface of the substrate that includes aluminum.

It is to be appreciated that the novel slurries and methods of the present invention can be used to form features other than interconnect lines. For example, the present invention can be used to form vias, interconnect lines, or other electrical connections In the preceding specification, specific details such as slurry chemistries, film compositions, and equipment parameters have been included to best describe the preferred embodiment. The present invention is not limited by these details, and various changes to these details are possible within the scope of the present invention. The specification and drawings must be regarded in an illustrative rather than a restrictive sense. The scope of the present invention is intended to be defined by the claims which follow. Several embodiments of the invention have thus been described. However, those of ordinary skill in the art will recognize that the invention is not limited to the embodiments described, but can be practiced with modification and alteration within the scope and spirit of the appended claims that follow.

We claim:

1. A chemical mechanical polishing slurry to polish aluminum or an aluminum alloy, the slurry comprising:
   a precipitated silica abrasive having a diameter of less than or equal to 100 nm;
   a chelating buffer system comprising citric acid and oxalic acid to provide a pH of the slurry in an approximate range of 1.5 to 4.0; and
   a reactive silanol agent comprising tetraethylorthosilicate (TEOS) provided to act as an interference agent.

2. The chemical mechanical polishing slurry of claim 1, wherein the slurry is formulated to polish aluminum.

3. The chemical mechanical polishing slurry of claim 1, wherein the precipitated silica abrasive is present in the slurry in the approximate range of 1.0 weight percent to 10.0 weight percent.

4. The chemical mechanical polishing slurry of claim 1, wherein citric acid is added to the slurry in an amount in an approximate range of 0.1 to 1.0 weight percent.

5. The chemical mechanical polishing slurry of claim 1, wherein oxalic acid is added to the slurry in an amount in an approximate range of 0.1 to 1.0 weight percent.

6. A chemical mechanical polishing slurry to polish aluminum or aluminum alloys, the slurry comprising:

a precipitated silica abrasive having a diameter in the approximate range of 10 nm and 50 nm;

a chelating buffer system comprising citric acid and oxalic acid to provide a pH in the approximate range of 1.8 to 2.1;

a reactive silanol agent comprising tetraethylorthosilicate (TEOS) provided to act as an interference agent;

water; and reaction products thereof.

7. The chemical mechanical polishing slurry of claim 6, wherein the amount of TEOS in the slurry is in the approximate range of 0.1 to 1.0 weight percent.

8. The chemical mechanical polishing slurry of claim 6, wherein the abrasive comprising precipitated silica has a diameter of approximately 35 nm.

* * * * *